(12) United States Patent  
Kanamura

(10) Patent No.: US 7,534,721 B2  
(45) Date of Patent: May 19, 2009

(54) SEMICONDUCTOR DEVICE MANUFACTURING DEVICE

(75) Inventor: Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 74 days.

(21) Appl. No.: 11/863,403

(22) Filed: Sep. 28, 2007

(65) Prior Publication Data

US 2008/0026563 A1    Jan. 31, 2008

Related U.S. Application Data

(62) Division of application No. 10/522,486, filed as application No. PCT/JP03/09602 on Jul. 29, 2003, now abandoned.

(30) Foreign Application Priority Data

Jul. 30, 2002    (JP) .............................. 2002-221069

(51) Int. Cl.
*H01L 21/4763* (2006.01)

(52) U.S. Cl. ................ 438/638; 438/623; 438/700; 438/734; 438/735; 257/E21.579

(58) Field of Classification Search ......... 438/622–624, 438/637–638, 640, 700–701, 734–737; 257/E21.575, 257/E21.579
See application file for complete search history.

(56) References Cited

U.S. PATENT DOCUMENTS 6,593,246 B1 *    7/2003    Hasegawa et al. ........... 438/736

2002/0009873 A1    1/2002    Usami  
2002/0025670 A1    2/2002    Miyata

FOREIGN PATENT DOCUMENTS

| CN | 1189224 | 7/1998 |
|---|---|---|
| CN | 1234787 | 11/1999 |
| CN | 1293770 | 5/2001 |
| GB | 22380316 | 9/2007 |

* cited by examiner

*Primary Examiner*—Thanhha Pham  
(74) *Attorney, Agent, or Firm*—Sonnenschein Nath & Rosenthal LLP

(57) ABSTRACT

A process for production of a semiconductor device having a multi-layer wiring of dual damascene structure in a low-dielectric constant interlayer insulating film. The process consists of the following steps. A first insulating film and a second insulating film are formed. A first to third mask forming layers are formed. The third mask forming layer is patterned so as to form the third mask for the wiring groove pattern. A resist mask of the connecting hole pattern is formed on the second mask forming layer including the third mask. The third mask and the second and first mask forming layers are etched, and the second insulating film is etched. The second mask of the wiring groove pattern is formed by using the third mask, and the connecting hole is made to the middle of the first insulating film. The first mask forming layer is etched by using the second mask, and the first mask of the wiring groove pattern is formed, and the first insulating film remaining at the bottom of the connecting hole is etched so as to make the connecting hole. The wiring groove is formed in the second insulating film by using the first or second mask.

5 Claims, 9 Drawing Sheets

SEMICONDUCTOR DEVICE MANUFACTURING DEVICE

RELATED APPLICATION DATA

This application is a divisional of U.S. patent application Ser. No. 10/522,486, filed Jan. 26, 2005, the entirety of which is incorporated herein by reference to the extent permitted by law. Application Ser. No. 10/522,486 is the Section 371 National Stage of PCT/JP03/09602. The present application claims priority to Japanese Patent Application No. 2002-221069 filed in the Japanese Patent Office on Jul. 30, 2002.

BACKGROUND OF THE INVENTION

The present invention relates to a process for production of a semiconductor device having the multi-layer wiring of dual damascene structure in the interlayer insulating film having a low dielectric constant. More particularly, the present invention relates to a process for production of a semiconductor device of dual damascene structure in good shape.

The recent advance in miniaturized and highly integrated semiconductor devices pose a serious problem with delay of electric signals resulting from the time constant of wiring. One way to address this problem is to form the conductive layer for the multi-layer wiring from low-resistant copper (Cu) in place of aluminum (Al) alloy.

Unfortunately, copper presents difficulties in patterning by dry etching unlike the conventional metallic material (such as aluminum) used for multi-layer wiring. Therefore, the multi-layer wiring of copper is formed usually by the damascene process, which consists of making a wiring groove in the insulating film and then burying copper in the wiring groove, thereby forming the wiring pattern. An example of the damascene process is disclosed in Japanese Patent Application No. Hei 10-143914. This process consists of forming a connecting hole and a wiring groove and then burying copper in the connecting hole and the wiring groove at the same time. This process is attracting attention because of its ability to decrease the number of steps.

Highly integrated semiconductor devices decrease in working speed as the wiring capacity increases. Consequently, they imperatively need the fine multi-layer wiring in which the interlayer insulating film is made of a low dielectric constant material which keeps low the wiring capacity.

The material for the low dielectric constant interlayer insulating film is fluorine-containing silicon oxide (FSG) having dielectric constant of about 3.5, which has been proved in practical use. It also includes ether polymers, such as polyaryl ether (PAE), and inorganic materials, such as hydrogen silsesquioxane (HSQ) and methyl silsesquioxane (MSQ), which have a dielectric constant of about 2.7. Recently, attempts are being made to reduce the dielectric constant to about 2.2 by making the above-mentioned material porous.

If the dual damascene process is to be applied to the low dielectric constant interlayer insulating film, it is necessary to eliminate the technical limitations mentioned in the following.

First, the low dielectric constant film is liable to damage in the step of removing the resist, because it is similar in composition to the resist used for patterning. In other words, it is essential to protect the low dielectric constant film from damage when the resist is peeled off after etching through it or when the resist undergoes restoration treatment (which is performed when the resist pattern does not meet the product specification after processing).

Second, the process should be applicable to the borderless structure which does not allow alignment margin for the wiring and the connecting hole.

Semiconductor devices of the latest generation, in which the multi-layer wiring has a design rule of 0.18 µm, should be fabricated by the process applicable to the borderless structure. Therefore, it is important that the process be able to make the wiring groove and the connecting hole simultaneously in the interlayer insulating film including the low dielectric constant film by the dual damascene process without noticeable variation in via resistance due to incomplete alignment.

Third, for the wiring groove to be formed under good control, it is desirable that an etch preventing film be placed near the bottom of the wiring groove. However, an etch preventing film having a comparatively high dielectric constant, which is placed in the interlayer insulating film, increases the interlayer capacity.

Thus, there is a need for the dual damascene process for the interlayer structure of low dielectric constant film which is capable of forming the wiring groove under good control while keeping the capacity low.

The dual damascene process that eliminates the technical restrictions mentioned above is disclosed in Japanese Patent Laid-open Nos. 2000-150519 and 2001-44189.

The application of the dual damascene process (disclosed in Japanese Patent Laid-open No. 2001-44189) to the low dielectric constant interlayer film will be described below with reference to FIGS. 7 to 9, which are sectional views illustrating the conventional steps for forming the dual damascene structure.

The process starts with the first step shown in FIG. 7A. A substrate (not shown) is coated with an underlying insulating film 1 by deposition. On the underlying insulating film 1 is formed an interlayer insulating film which is composed of an organic film 2 and a silicon oxide ($SiO_2$) film 3. In the interlayer insulating film is formed a buried wiring 4 of copper (Cu) film.

On the Cu buried wiring 4 is formed a silicon carbide (SiC) film 5 as an oxidation protecting layer. On the SiC film 5 are formed a carbon-containing silicon oxide (SiOC) film 6 as a methyl silsesquioxane (MSQ) film and a polyaryl ether (PAE) film 7 as an organic film.

Then, a silicon oxide ($SiO_2$) film 8 as a first mask forming layer and a silicon nitride (SiN) film 9 as a second mask forming layer are formed sequentially. On the SiN film 9 is formed a resist mask 10 having a wiring groove pattern.

Then, as shown in FIG. 7B, dry etching is performed on the SiN film 9 through the resist mask 10, thereby forming a second mask 11 of SiN film having the wiring groove pattern. Subsequently, the resist mask 10 is removed.

A resist mask 12 having the connecting hole pattern is formed on the second mask 11 and the $SiO_2$ film 8 in such a way that at least part of the resist having the connecting hole pattern overlaps with the second mask 11 of SiN film which has the wiring groove pattern.

As shown in FIG. 8A, dry etching is performed on the second mask 11 of SiN film and the $SiO_2$ film 8 of the first mask forming layer through the resist mask 12 having the connecting hole pattern, thereby making a hole. Etching is performed on the PAE film 7, thereby making the connecting hole 13 which causes the SiOC film 6 to expose itself. The resist mask 12 is removed when the PAE film 7 undergoes etching.

While a hole is being made in the PAE film 7, the resist mask 12 gets thin, but it is possible to make the connecting hole 13 with a good opening shape because the first mask 8A of $SiO_2$ film 8 still exists.

Then, as shown in FIG. 8B, etching is further performed on the SiOC film 6 until the connecting hole 13 reaches the SiC film 5, thereby making the connecting hole 14. When the connecting hole 14 is made, the SiO$_2$ film 8 (which remains in the wiring groove forming region and forms the first mask 8A) is removed by etching through the second mask 11 of SiN film having the wiring groove pattern. This step makes the opening 15.

As shown in FIG. 8C, etching is performed on the PAE film 7 remaining at the bottom of the opening 15, thereby making the wiring groove 16. Etching is performed on the SiC film 5 at the bottom of the connecting hole 14, thereby causing the connecting hole 14 to communicate with the Cu buried wiring 4. In this way the desired dual damascene process is completed, or the process to make the wiring groove 16 and the connecting hole 14 is completed.

Incidentally, the second mask 11 of SiN film remaining outside the wiring groove forming region is removed while etching is being performed on the SiC film 5 at the bottom of the connecting hole 14.

Post-treatment with a chemical solution and RF sputtering are performed to remove etching residues remaining on the side wall of the wiring groove 16 and the connecting hole 14 and to restore the deteriorated Cu layer at the bottom of the connecting hole 14. Then, as shown in FIG. 9A, a Ta film 17 (as a barrier metal layer) is formed by sputtering. A Cu film 18 is deposited by electrolytic plating or sputtering, so that the wiring groove 16 and the connecting hole 14 are filled with a conducting film.

Then, as shown in FIG. 9B, the Ta film 17 and Cu film 18 deposited as mentioned above undergo chemical-mechanical polishing (CMP) to remove those parts unnecessary for wiring pattern. In this way there is obtained the multi-layer wiring of dual damascene structure.

Further, an SiC film 19 (as an oxidation protecting layer) is formed on the Cu film 18 as in the case of the underlying Cu buried wiring 4.

The dual damascene process with the double layer etching masks as mentioned above is exempt from the technical limitations mentioned above when applied to the low dielectric constant interlayer film structure.

In other words, it is possible to recover the resist masks 10 and 12 not meeting the product specification by treatment on the SiO$_2$ 8 film as the first mask forming layer or on the SiN film 9 as the second mask forming layer. Moreover, it is also possible to remove the resist mask 12 (used to make the connecting hole) when the connecting hole 13 is made by etching on the PAE film 7. Therefore, it is possible to peel off the resist without damage to the low dielectric constant film.

Since the connecting hole 13 (or the connecting hole 14) is made through the second mask 11 of SiN film having the wiring groove pattern, there is no possibility that the connecting hole 14 varies in dimensions even when incomplete alignment occurs between the wiring groove 16 and the connecting hole 14.

When the wiring groove 16 is made in the PAE film 7 formed on the SiOC film 6, the combination of the inorganic MSQ film (SiOC film 6) and the organic polymer film (PAE film 7) easily allows an adequate etching selectivity. This makes it possible to control the depth of the wiring groove 16 easily without the help of the etching preventing film (such as SiN film) having a high dielectric constant.

The dual damascene process mentioned above has still problems as follows when it is applied to the multi-layer wiring that should conform to the design rule of 0.18 μm.

First, the second mask forming layer (or the SiN film 9) becomes thicker than necessary. The second mask 11 is intended for etching on the SiOC film (MSQ film) 6 as the interlayer film for the connecting hole, thereby making the connecting hole 14 and also making the opening 15 in the wiring groove forming region. Therefore, it needs a certain thickness. For example, in the case where the SiOC film 6, 400 nm thick, as the interlayer film for the connecting hole, is to be made by using the SiN film 9 as the second mask 11, the SiN film 9 should have a thickness of 100 to 150 nm from the view point of etching selectivity, so as to prevent the wiring groove from opening expansion or shoulder rounding.

Second, the resist mask 12 is formed on the step several times. This presents difficulties in forming fine patterns accurately.

In the step of fabricating the SiN film 9 (as the second mask forming layer), thereby forming the second mask 11 having the wiring groove pattern, the etching selectivity (SiN/SiO$_2$) for the SiO$_2$ film 8 as the first mask forming layer is only about 2 to 3. Therefore, in case of over etching on the SiN film 9, the underlying SiO$_2$ film 8 is attacked more than 30 nm, as shown in FIG. 7B. This necessitates forming the resist mask 12 (having the connecting hole pattern) on the step with a height of 130 to 180 nm.

However, forming a fine resist pattern for the design rule of 0.10 μm on a local step slightly lower than 200 nm is much more difficult than forming it on a flat surface on account of resist mask spreading and uncontrollable line width.

Third, in the case where the common antireflection film (BARC) of coating type is used in the lithography step, it varies in its buried shape depending on the dimensions and density of the pattern on the second mask 11. This results in variation in depth of field, which in turn deteriorates the shape of the resist at the time of exposure or deteriorates the shape of the second mask 11 when the connecting hole is made by etching on the BARC film.

Fourth, according to the conventional dual damascene process mentioned above, patterning of the wiring groove through the resist mask 10 is performed before patterning of the connecting hole 13 through the resist mask 12. This leads to indirect mask alignment for the wiring groove 16 and the connecting hole 14. As compared with the ordinary process in which the pattern of the connecting hole is made first, the above-mentioned process causes more incomplete alignment for the upper wiring and the connecting hole.

A solution to the above-mentioned problems is disclosed in Japanese Patent Laid-open No. 2000-150519, for example. According to this disclosure, the second mask is formed from a metal so as to increase the etching selectivity for the MSQ film (as the connecting hole interlayer), thereby reducing the thickness of the second mask and decreasing the step arising from resist patterning.

Unfortunately, the metal film is almost opaque to light (with a wavelength of 200 to 1000 nm) used for mask alignment. Therefore, if the metal film is formed over the entire surface, it makes it impossible to perform alignment with light of ordinary wave lengths or alignment by image processing in the exposure step.

Thus, it is an object of the present invention to provide a process for producing in high yields a highly reliable and high-performance semiconductor device having a multi-layer wiring structure. The process is characterized in that a load on resist patterning is reduced and a good shape is obtained by the dual damascene process when the dual damascene structure is formed in the low dielectric constant interlayer insulating film of PAE film and MSQ film.

DISCLOSURE OF THE INVENTION

The present invention to achieve the above-mentioned object is directed to a process for production of a semiconductor device having interlayer insulating films including an organic insulating film, said process including:

a step of sequentially forming on an interlayer insulating film three or more etching mask forming layers consisting of mutually different two or more kinds of film, a step of patterning the uppermost etching mask forming layer, thereby forming the uppermost mask layer, etching the next stage etching mask forming layer under the uppermost etching mask forming layer through the uppermost layer mask, thereby forming the next stage etching mask, etching the next stage etching mask forming layer after next through the next stage etching mask, thereby forming the next stage etching mask after next, and sequentially etching the etching mask forming layer under the etching mask forming layer formed thereon through the etching mask formed through the etching mask forming layer formed thereon, thereby forming the etching mask, and a step of etching the interlayer insulating film through the thus formed etching mask, thereby forming the wiring groove and the connecting hole, with one etching mask forming layer out of the three or more etching mask forming layers being formed as the mask forming layer for the wiring groove pattern and one etching mask forming layer out of the remaining layers being formed as the mask forming layer for the connecting hole pattern.

The foregoing represents the important technical constituents of the process according to the present invention. To be concrete, the first aspect of the present invention is directed to a process for production of a semiconductor device having interlayer insulating films including an organic insulating film, said process including:

(a) a step of sequentially forming on a semiconductor substrate a first insulating film as an insulating film which the connecting hole penetrates, and a second insulating film as an interlayer insulating film for wiring, (b) a step of sequentially forming on the second insulating film a first mask forming layer, a second mask forming layer, and a third mask forming layer, which are to be made into a first mask, a second mask, and a third mask, respectively, (c) a step of patterning the third mask forming layer, thereby forming the third mask having the wiring groove pattern, (d) a step of forming on the second mask forming layer including the third mask a resist mask having the connecting hole pattern, (e) a step of etching the third mask, the second mask forming layer, and the first mask forming layer through the resist mask, and etching further the second insulating film, thereby making the connecting hole, (f) a step of etching the second mask forming layer through the third mask, thereby forming the second mask having the wiring groove pattern and making the connecting hole to the middle of the first insulating film, (g) a step of etching the first mask forming layer through the second mask, thereby forming the first mask having the wiring groove pattern, and etching the first insulating film remaining at the bottom of the connecting hole, thereby making the connecting hole, (h) a step of etching the second insulating film through the first or second mask, thereby forming the wiring groove in the second insulating film, and (i) a step of removing at least the second and third masks.

The first aspect of the present invention offers the following advantages. When the resist mask having the connecting hole pattern is formed in step (d), the step on the underlying layer is kept small in proportion to the third mask forming layer, and this makes it possible to form the resist mask having the accurate connecting hole. In this way it is possible to make the fine connecting hole in a stable manner without aggravating the shape of the wiring groove. Thus it is possible to obtain the good via contact characteristics.

The dual damascene process to which the present invention is applied makes it possible to produce in high yields semiconductor devices having accurately formed multi-layer wirings.

The second aspect of the present invention is directed to a process for production of a semiconductor device having interlayer insulating films including an organic insulating film, said process including:

(a) a step of sequentially forming on a semiconductor substrate a first insulating film as an insulating film which the connecting hole penetrates, and a second insulating film as an interlayer insulating film for wiring, (b) a step of sequentially forming on the second insulating film a first mask forming layer, a second mask forming layer, and a third mask forming layer, which are to be made into a first mask, a second mask, and a third mask, respectively, (c) a step of forming on the third mask forming layer a first resist mask having the connecting hole pattern, (d) a step of making the connecting hole in the third mask forming layer and the second mask forming layer and to the middle of the third mask forming layer through the first resist mask, (e) a step of forming on the third mask forming layer a second resist mask having the wiring groove pattern, and etching the third mask forming layer through the second resist mask, thereby forming the third mask, (f) a step of etching the second mask forming layer and the second insulating film through the third mask, thereby making the connecting hole, (g) a step of etching the second mask forming layer through the third mask, thereby forming the second mask having the wiring groove pattern and etching the first insulating film to its middle, thereby making the connecting hole, (h) a step of etching the first mask forming layer through the second mask, thereby forming the first mask having the wiring groove pattern, and etching the first insulating film, thereby making the connecting hole, (i) a step of etching the second insulating film through the first or second mask, thereby forming the wiring groove, and (j) a step of removing at least the second and third masks.

The second aspect of the present invention offers the following advantages. When the resist mask having the connecting hole pattern is formed in step (c), the underlying layer is almost flat, and this makes it possible to form the resist mask having the accurate connecting hole. In this way it is possible to make the fine connecting hole in a stable manner without aggravating the shape of the wiring groove. Thus it is possible to obtain the good via contact characteristics.

Moreover, the patterning of the wiring groove is performed after the patterning of the connecting hole, and this avoids the indirect mask alignment of the upper layer wiring and the connecting hole. Therefore, it is possible to form the multi-layer wiring having a small alignment difference.

The dual damascene process to which the present invention is applied makes it possible to produce in high yields semiconductor devices having accurately formed multi-layer wirings.

According to the first and second aspects of the present invention, the preferred embodiments are carried out as follows. In step (a), the first insulating film is a methyl silsesquioxane film and the second insulating film is an organic film. These films contribute to reduction in static capacity between wirings.

In step (b), the first, second, and third mask forming layers are formed from a material which is transparent to light.

In step (b), the first, second, and third mask forming layers are formed from a material that permits the lower mask forming layer to be formed by reactive ion etching through the mask formed on the upper mask forming layer. This facilitates forming the first to third masks.

In step (b) of the first aspect of the present invention, the first mask forming layer is a silicon oxide film, the second mask forming layer is a silicon nitride film, and the third mask forming layer is a silicon oxide film. In step (b) of the second aspect of the present invention, the first mask forming layer is a silicon oxide film, the second mask forming layer is a silicon nitride film, and the third mask forming layer is an amorphous silicon film.

DETAILED DESCRIPTION OF THE PRESENTLY PREFERRED EMBODIMENTS

The embodiments of the present invention will be described in more detail with reference to the accompanying drawings. Specific film type, film thickness, film forming method, and film dimensions shown in them are intended to help understand the present invention but are not intended to restrict the scope of the present invention.

Embodiment 1

Figure 7A:
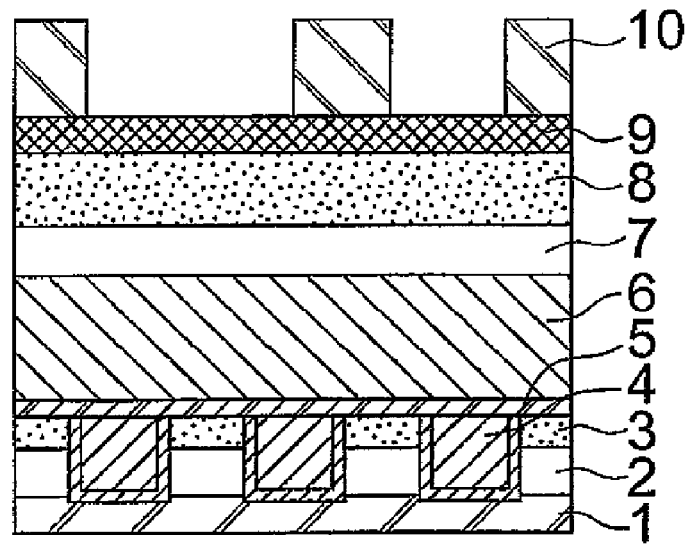
FIGS. 7A and 7B are sectional views showing the steps of forming the dual damascene structure according to the conventional method.
Figure 7B:
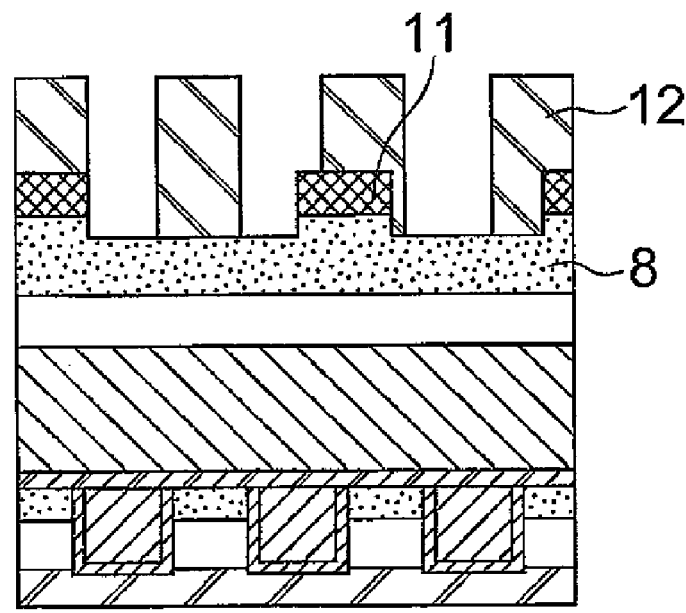
Figure 8A:
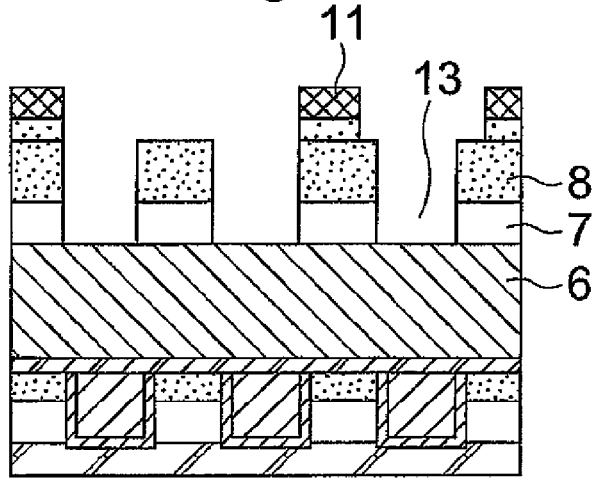
FIGS. 8A to 8C are sectional views showing the steps of forming the dual damascene structure, which follow the step shown in FIG. 7B, according to the conventional method.
Figure 8B:
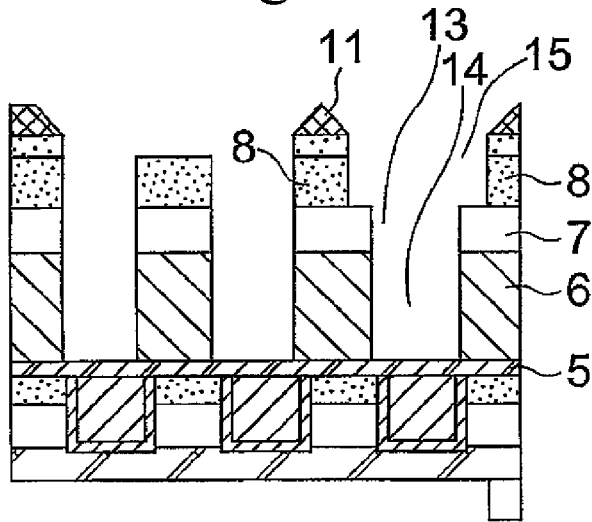
Figure 8C:
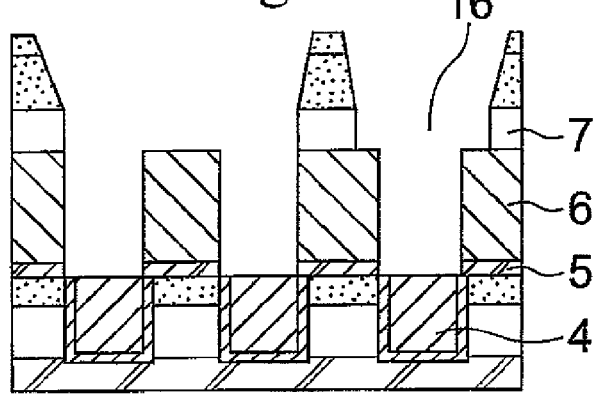
Figure 9A:
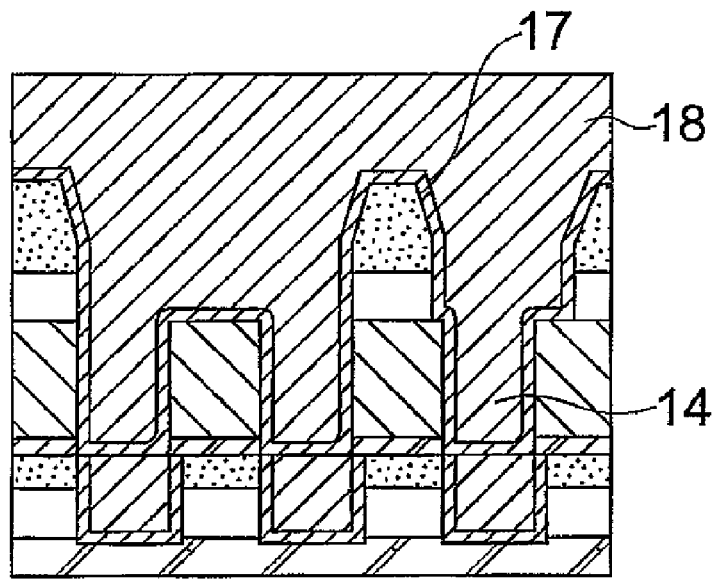
FIGS. 9A and 9B are sectional views showing the steps of forming the dual damascene structure, which follow the step shown in FIG. 8C, according to the conventional method.
Figure 9B:
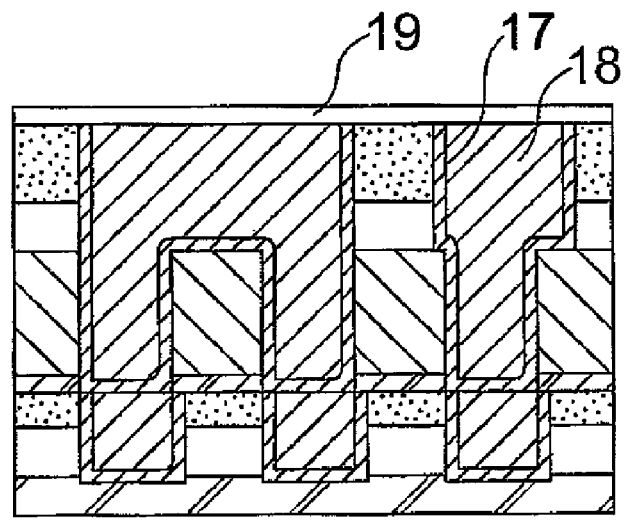

This embodiment demonstrates the process for production of a semiconductor device according to the first aspect of the present invention. FIGS. 1 to 3 are sectional views each showing the steps of forming the dual damascene structure on the semiconductor substrate by the process employed in this embodiment. Identical symbols are used to indicate those parts in FIGS. 1 to 3 and those parts in FIG. 7 to 9, which function in the same way. This applies also to FIGS. 4 to 6.

Figure 1A:
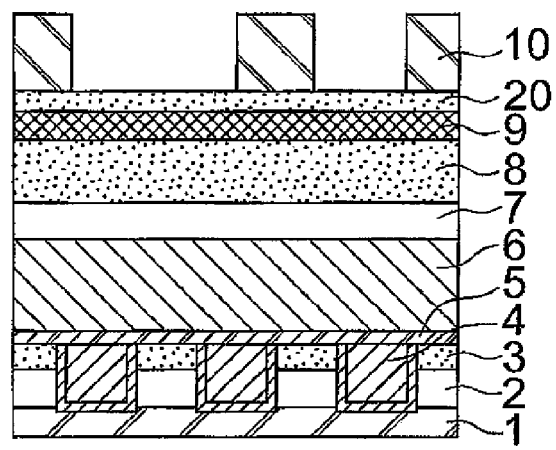
FIGS. 1A to 1C are sectional views showing the steps of forming the dual damascene structure according to the method of Embodiment 1.

The process of this embodiment starts with the first step shown in FIG. 1A. A substrate (not shown) is coated with an underlying insulating film 1 by deposition. On the underlying insulating film 1 is formed an interlayer insulating film which is composed of an organic film 2 and a silicon oxide ($SiO_2$) film 3. In the interlayer insulating film is formed a buried wiring 4 of copper (Cu) film, which is 250 nm thick.

On the Cu wiring 4 is formed a silicon carbide (SiC) film 5, 50 nm thick, as an oxidation protecting layer. On the SiC film 5 is formed a carbon-containing silicon oxide (SiOC) film 6, 400 nm thick, as an interlayer insulating film which the connecting hole penetrates.

The SiC film 5 and the SiOC film 6 are formed by using a CVD apparatus of parallel plate type and methyl silane gas as the silicon source.

The CVD process is carried out under the following conditions.
Substrate temperature: 300 to 400° C.
Plasma power: 150 to 350 W
Pressure of film-forming atmosphere: 100 to 1000 Pa The CVD process under the foregoing condition gives the SiC film 5 and the SiOC film 6, which have a dielectric constant of about 5.0 and about 3.0, respectively.

On the SiOC film 6 is formed an organic polymer film having a dielectric constant of about 2.6. In this embodiment, the organic polymer film is a polyaryl ether (PAE) film 7, which is 200 nm thick. It is formed by curing a spin-coated film of a precursor at 400 to 450° C.

The PAE film may be replaced by BCB film, polyimide film, or amorphous carbon film.

On the PAE film 7 are sequentially formed an $SiO_2$ film 8, 150 nm thick, which functions as a first mask forming layer, a silicon nitride (SiN) film 9, 100 nm thick, which functions as a second mask forming layer, and an $SiO_2$ film 20, 50 nm thick, which functions as a third mask forming layer.

On the $SiO_2$ film 20 is formed a resist mask 10 having the wiring groove pattern as the resist pattern.

The $SiO_2$ film 8 (as a first mask forming film) and the $SiO_2$ film 20 (as a third mask forming film) may be formed by the plasma CVD process which employs monosilane ($SiH_4$) as the silicon source and dinitrogen monoxide ($N_2O$) gas as the oxidizing agent.

If there is the possibility that the PAE film 7 is oxidized when the $SiO_2$ film 8 is formed, the $SiO_2$ film should be formed such that it contains more silicon than the stoichiometric amount.

The SiN film 9 as a second mask forming layer may be formed by the same CVD process as used for the $SiO_2$ films 8 and 20 which employs monosilane ($SiH_4$) as the silicon source, ammonia gas ($NH_3$) as the nitrogen source, and dinitrogen monoxide ($N_2O$) gas as the oxidizing agent.

Figure 1B:
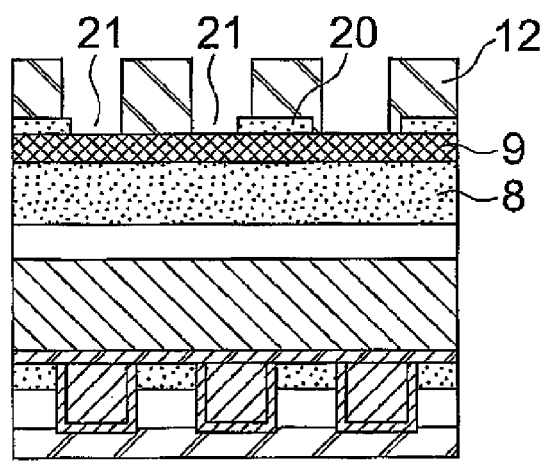

Then, as shown in FIG. 1B, dry etching is performed on the $SiO_2$ film 20 as a third mask forming layer, through the resist mask 10, so that a third mask having the wiring groove pattern 21 is formed.

The etching of the $SiO_2$ film 20 through the resist mask 10 is accomplished by using an ordinary etching apparatus of magnetron type, with the bias power adjusted to 1200 W and the substrate temperature adjusted to 20° C. This etching employs an etching gas composed of octafluorobutane ($C_4F_8$), carbon monoxide (CO), and argon (Ar), with their flow rate in a ratio of 1:5:20 ($C_4F_8$:CO:Ar).

Under this etching condition, the SiN film 9 as an underlying second mask forming layer is rarely subject to etching, because the etching selectivity ($SiO_2$/SiN) for the SiN film is higher than 10.

After the $SiO_2$ film 20 has undergone etching, ashing with oxygen ($O_2$) plasma and chemical treatment with organic amine are performed to completely remove the resist mask 10 and residues remaining after etching.

As shown in FIG. 1B, a resist mask 12 having a pattern for connecting holes is formed on the $SiO_2$ film 20 and the SiN film 9, in such a way that at least part of the pattern of connecting holes overlaps with the $SiO_2$ film 20 constituting the wiring groove pattern 21 of the third mask.

When the resist mask 12 is formed, the $SiO_2$ film 20 constituting the wiring groove pattern 21 gives a step with a height of about 50 nm, which is equivalent to thickness f the $SiO_2$ film 20. This step is low enough for lithography to make a satisfactory resist mask. Thus there is obtained a resist pattern for connecting holes as desired.

In the case where an anti-reflective coating (BARC) of coating type is used, the wiring groove pattern 21 minimizes variation in the shape of BARC buried because of its dimensions and arrangement. This reduces variation in the depth of focus which affects the shape and dimensions of the resist at the time of exposure.

Figure 1C:
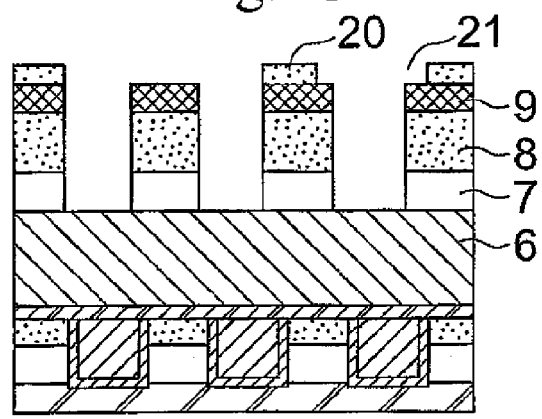

Dry etching is performed, through the resist mask 12 having the pattern of connecting holes, on the $SiO_2$ film 20 in the region where connecting holes are to be formed, the SiN film 9 as a second mask forming layer, and the $SiO_2$ film 8 as a first mask forming layer. Then, etching is performed on the PAE film 7 through the remaining SiN film 9 as a second mask. This etching makes connecting holes 13 which permit the SiOC film 6 to expose itself, as shown in FIG. 1C.

Incidentally, the resist mask 12 can be removed simultaneously with etching on the PAE film 7.

The remaining $SiO_2$ film 20 functions as a mask for the wiring groove pattern, and the SiN film 9 which has undergone etching functions as a second mask having the pattern of connecting holes.

Etching to make the connecting holes 13 in the $SiO_2$ film 20 (as a third mask forming layer), the SiN film 9 (as a second mask forming layer), and the $SiO_2$ film 8 (as a first mask forming layer) may be accomplished by using an ordinary etching apparatus of magnetron type with the bias power adjusted to 400 W and the substrate temperature adjusted to 20° C. This etching employs an etching gas composed of octafluorobutane ($C_4F_8$) and argon (Ar), with their flow rate in a ratio of 1:4 ($C_4F_8$:Ar).

In this embodiment, the etching selectivity ($SiO_2$/SiN) under the above-mentioned etching condition is approximately 1. The connecting hole 13 through the three layers (first to third mask forming layers) can be made in one step of etching.

However, one-step etching is not necessarily essential. If a resist selectivity or an etching conversion difference varies depending on the resists, etching can be performed in three steps sequentially on the first mask forming layer, the second mask forming layer, and the third mask forming layer. In this case it is necessary to adopt an adequate selectivity for the underlying mask forming layer or insulating film.

The connecting hole in the PAE film 7 may be made by using an ordinary high-density plasma etching apparatus. In this case the etching gas is ammonia ($NH_3$) and the RF power is set at 150 W and the substrate temperature is adjusted to 20° C.

Under this etching condition, the resist mask 12 undergoes etching at almost the same rate as the PAE film 7. Thus, while holes are being made in the PAE film 7, the resist mask 12 gets thin. However, the SiN film 9 as the second mask functions as the etching mask, thereby permitting satisfactory connecting holes to be made.

Incidentally, etching on the PAE film 7 under the above-mentioned condition has the etching selectivity equal to or higher than 100 for the SiN film, $SiO_2$ film, and SiOC film.

Figure 2A:
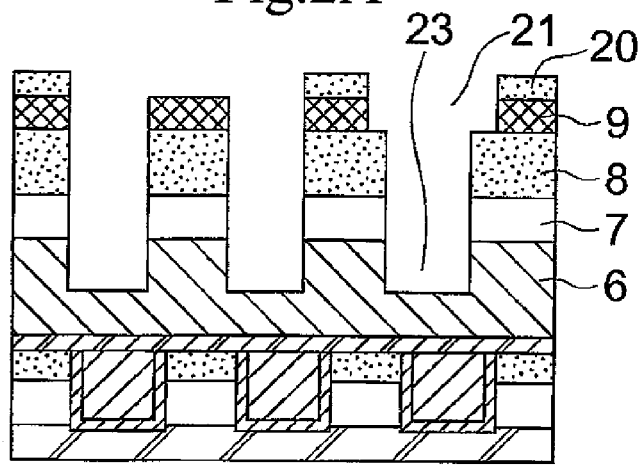
FIGS. 2A to 2C are sectional views showing the steps of forming the dual damascene structure, which follow the step shown in FIG. 1C, according to the method of Embodiment 1.

Next, as shown in FIG. 2A, dry etching is performed on the SiN film 9 to form the second mask having the wiring groove pattern 22, through the $SiO_2$ film 20 having the wiring groove pattern 21 as the third mask.

Etching on the SiN film 9 may be carried out by using an ordinary etching apparatus of magnetron type, with the bias power adjusted to 100 W. This etching employs an etching gas composed of difluoromethane ($C_2F_2$), oxygen ($O_2$), and argon (Ar), with their flow rate in a ratio of 2:1:5 ($C_2F_2$:$O_2$:Ar).

Etching under this condition allows the etching selectivity of about 3 (SiN/$SiO_2$) for the $SiO_2$ film. Therefore, so long as the $SiO_2$ film 20 (as the third mask forming layer) is about 50 nm thick, etching on the SiN film 9 (as the second mask forming layer), which is 100 nm thick, makes the wiring groove pattern 22 with sufficient allowance for the $SiO_2$ film 20 decreasing in thickness.

Etching on the SiN film 9 as the second mask forming layer, which employs the $SiO_2$ film 20 as the third mask, reaches the middle of the SiOC film 6 which exposes itself at the bottom of the connecting hole 23.

Etching on the SiOC film under this condition allows an etching selectivity slightly lower than 1 (SiN/SiN). Therefore, in the case where etching is performed on the SiN film 9, which is 100 nm thick, the connecting hole 23 is made as deep as 150 to 200 nm in the SiOC film 6, with the amount of anticipated overetching taken into account.

Figure 2B:
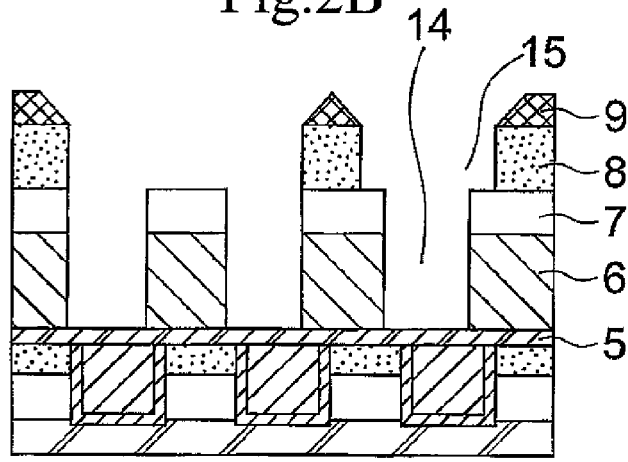

Next, etching is performed on the lower layer of the SiOC film 6 through the $SiO_2$ film 8 (which is the first mask) as the mask, so as to make the connecting hole 14 which permits the SiC film 5 to expose itself, as shown in FIG. 2B.

This etching also removes the $SiO_2$ film 8 (as the first mask) remaining in the wiring groove region, by using the SiN film 9 (as the second mask 11) having the wiring groove pattern, so as to make the opening 15.

This etching may be accomplished by using an ordinary etching apparatus of magnetron type with the bias power adjusted to 1600 W and the substrate temperature adjusted to 20° C. This etching employs an etching gas composed of octafluoropentene ($C_5F_8$), carbon monoxide (CO), argon (Ar), and oxygen ($O_2$), with their flow rate in a ratio of 1:10:5:1 ($C_5F_8$:CO:Ar:$O_2$).

Etching on the SiN film under this condition allows an etching selectivity equal to or higher than 10 (SiOC/SiN). Therefore, in the case where etching is performed on the SiOC film 6, 200 to 250 nm thick, remaining on the bottom of the connecting hole, it is possible to make a satisfactory opening, without the wiring groove expanding upward or the shoulder getting round, while giving an allowance for decrease in the thickness of the SiN film 9, so long as the SiN film 9, as the second mask, is 100 nm thick.

Figure 2C:
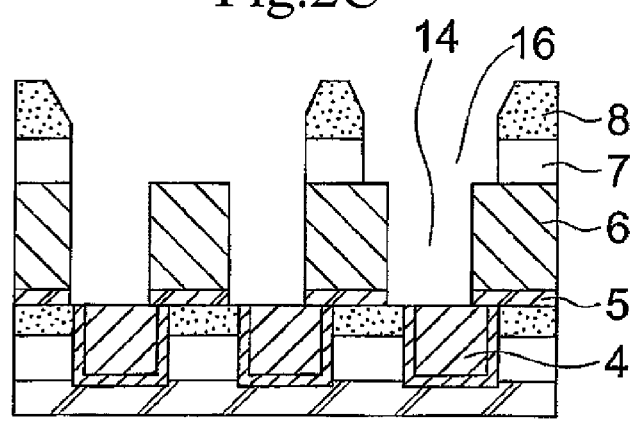

Then, as shown in FIG. 2C, etching is performed on the PAE film remaining on the bottom of the wiring groove in order to make the wiring groove 16. Etching is performed on the SiC film 5 at the bottom of the connecting hole. This completes the dual damascene process for communication of the connecting hole 14 with the buried wiring 4 of Cu film.

Etching on the PAE film 7 to make the wiring groove 16 is accomplished by using an ordinary high-density plasma etching apparatus. In this case the etching gas is ammonia ($NH_3$) and the RF power is set at 150 W and the substrate temperature is adjusted to 20° C.

Etching under this condition allows an etching selectivity equal to or higher than 100 for the SiOC film 6; therefore, it makes the wiring groove without causing variation in depth.

This etching on the SiC film 5 at the bottom of the connecting hole 14 may be accomplished by using an ordinary etching apparatus of magnetron type with the bias power adjusted to 100 W. This etching employs an etching gas composed of difluoromethane ($CH_2F_2$), oxygen ($O_2$), and argon (Ar), with their flow rate in a ratio of 2:1:5 ($CH_2F_2:O_2:Ar$).

Etching under the above-mentioned condition allows an etching selectivity of about 1 for the SiOC film 6. Therefore, etching on SiC film 5 may be carried out previously before the wiring groove is made in the PAE film 7 so as to avoid attack on the SiOC film 6 at the bottom of the wiring groove 16.

Incidentally, the SiN film 9 remaining on the $SiO_2$ film 8 is removed when etching is being performed on the SiC film 5 at the bottom of the connecting hole 14.

Figure 3A:
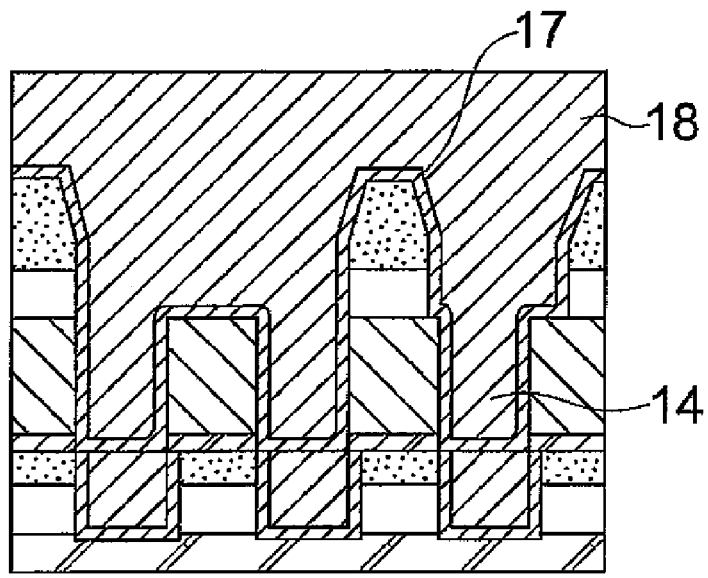
FIGS. 3A and 3B are sectional views showing the steps of forming the dual damascene structure, which follow the step shown in FIG. 2C, according to the method of Embodiment 1.

Etching residues remaining on the side wall of the wiring groove 16 and the connecting hole 14 are removed by chemical treatment and ensuing RF sputtering. Then, the deteriorated Cu layer at the bottom of the connecting hole 14 is restored to the normal one. Next, as shown in FIG. 3A, the Ta film 17 (as the barrier metal film) is formed by sputtering. The Cu film 18 is deposited on it by electrolytic plating or sputtering. In this way the conductive film is buried in the wiring groove 16 and the connecting hole 14 at the same time.

Figure 3B:
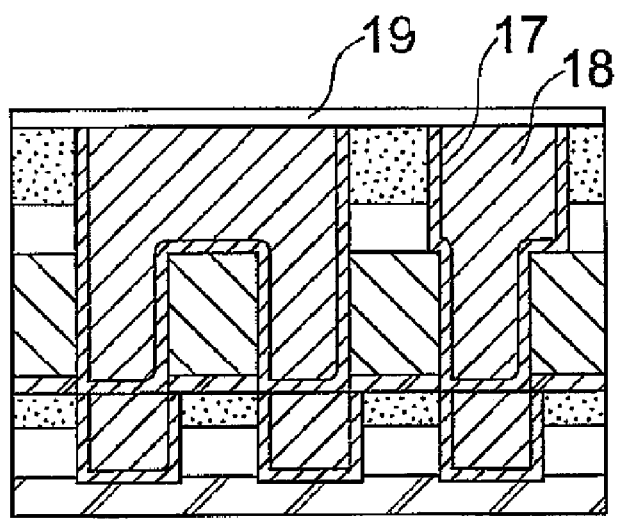

Further, as shown in FIG. 3B, the Ta film 17 and the Cu film 18 deposited as mentioned above undergo chemical-mechanical polishing (CMP) so as to remove those parts which are not necessary for the wiring pattern. In this way it is possible to form the multi-layer wiring of dual damascene structure.

In this embodiment, the film for the upper layer wiring is adjusted to a thickness of about 250 nm. As in the case of the lower layer wiring, the SiC film 19 is formed on the Cu film 18 for protection from oxidation.

The above-mentioned steps to form the multi-layer wiring of dual damascene structure offers the advantage of being able to make the very small connecting hole without affecting the shape of the wiring groove owing to the resist mask having the highly accurate connecting hole pattern. This is because the resist mask 12 having the connecting hole pattern is formed such that the step of the underlying layer is minimized to about 50 nm which is equal to the thickness of the remaining $SiO_2$ film 20.

The resulting multi-layer wiring provides good via contact characteristics. Moreover, the process according to this embodiment gives in high yields the semiconductor device with dual damascene structure which has a good wiring shape in the interlayer insulating film having a low dielectric constant.

Embodiment 2

This embodiment demonstrates the process for production of a semiconductor device according to the second aspect of the present invention. FIGS. 4 to 6 are sectional views each showing the steps of forming the dual damascene structure by the method employed in this embodiment.

Figure 4A:
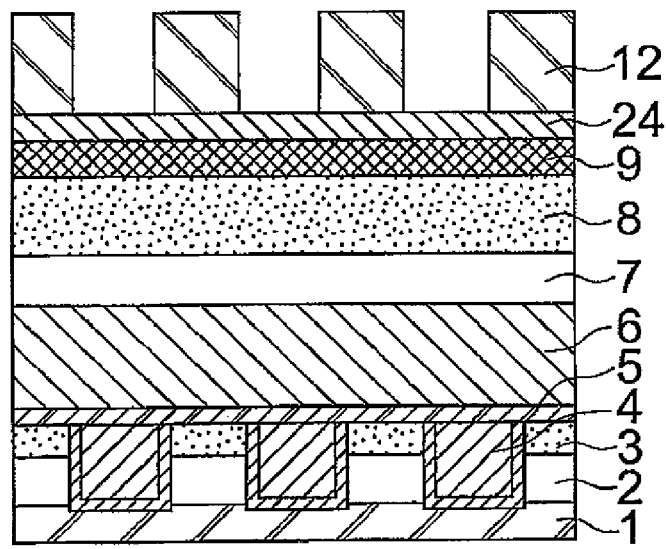
FIGS. 4A and 4B are sectional views showing the steps of forming the dual damascene structure according to the method of Embodiment 2.

As in Embodiment 1, the process of this embodiment starts with the first step shown in FIG. 4A. A substrate (not shown) is coated with an underlying insulating film 1 by deposition. On the underlying insulating film 1 is formed an interlayer insulating film which is composed of an organic film 2 and a silicon oxide ($SiO_2$) film 3. In the interlayer insulating film is formed a buried wiring 4 of copper (Cu) film.

On the buried wiring 4 of Cu film is formed a silicon carbide (SiC) film 5, 50 nm thick, as an oxidation preventing film. Then, a carbon-containing silicon oxide (SiOC) film 6, 400 nm thick, is formed. Further, a polyaryl ether (PAE) film 7, 200 nm thick, is formed, which is an organic polymer layer having a dielectric constant of about 2.6.

On the PAE film 7 are sequentially formed an $SiO_2$ film 8, 150 nm thick, which functions as a first mask forming layer, and a silicon nitride (SiN) film 9, 100 nm thick, which functions as a second mask forming layer.

An amorphous silicon (a-Si) film 24, 50 nm thick, is formed, which functions as a third mask forming layer. This step is accomplished by sputtering that employs a silicon target in an argon plasma. In this embodiment, the $SiO_2$ film in Embodiment 1 is replaced by the a-Si film 24 as a third mask forming layer.

On the a-Si film 24 is formed a resist mask 12 having the connecting hole pattern.

Figure 4B:
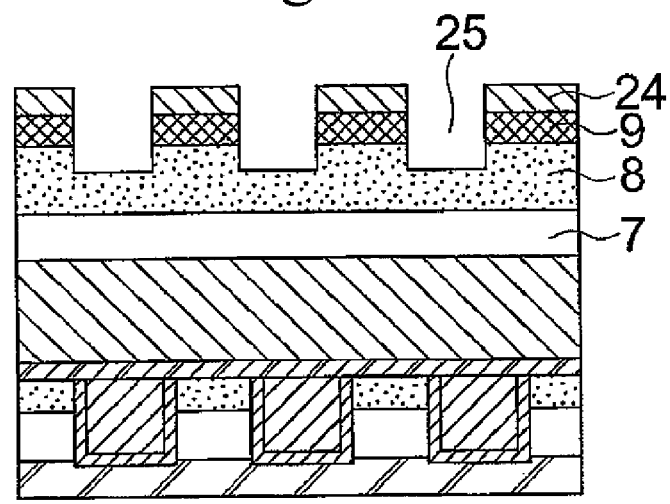

As shown in FIG. 4B, dry etching is performed through the resist mask 12 having the connecting hole pattern. This dry etching penetrates the a-Si film 24 (as the third mask forming layer) and the SiN film 9 (as the second mask forming layer) and terminates at the middle of the $SiO_2$ film 8 (as the first mask forming layer). In this way the connecting hole pattern 25 is formed.

Ashing with oxygen ($O_2$) plasma and chemical treatment with organic amine are performed to completely remove the resist mask 12 and residues remaining after etching.

Etching on the a-Si film 24 (as the third mask forming layer) may be accomplished by using an ordinary plasma etching apparatus, with the RF power adjusted to 20 W and the substrate temperature adjusted to 0° C. This etching employs an etching gas composed of chlorine ($Cl_2$), hydrobromic acid (HBr), and oxygen ($O_2$), with their flow rate adjusted to 10:2:1 ($Cl_2:HBr:O_2$).

Etching on the SiN film 9 (as the second mask forming layer) and the $SiO_2$ film 8 (as the first mask forming layer) may be accomplished by using an ordinary etching apparatus of magnetron type, with the bias power adjusted to 400 W and the substrate temperature adjusted to 20° C. This etching employs an etching gas composed of octafluorobutane ($C_4F_8$) and argon (Ar), with their flow rate adjusted to 1:4 ($C_4F_8:Ar$).

Etching under this condition allows a selectivity ($SiO_2/SiN$) of about 1. Therefore, etching is performed on the SiN film 9 and the $SiO_2$ film 8 all together in this embodiment. However, etching may be performed in two steps if there is any problem with the resist selectivity or etching conversion difference. In this case, the first selective etching is performed on the SiN film 9 (as the second mask forming layer), and the second selective etching is performed on the $SiO_2$ film 8 (as the first mask forming layer) under different conditions for a higher resist selectivity.

Incidentally, etching on the $SiO_2$ film 8 (as the first mask forming layer) should be performed to such an extent the PAE film 7 does not expose itself. In other words, an $SiO_2$ film, which is about 50 to 100 nm thick, remains on the PAE film 7.

Figure 5A:
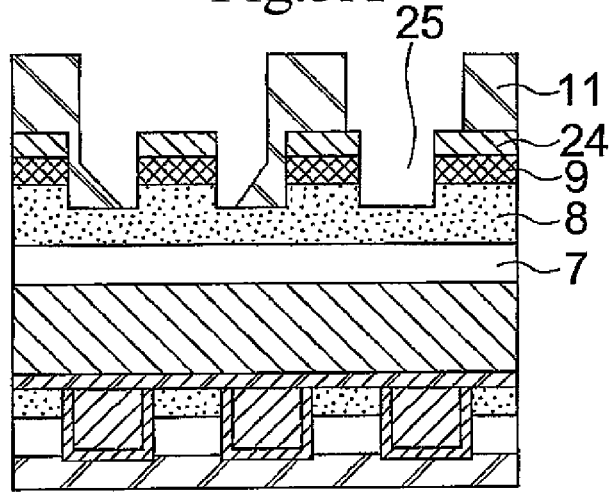
FIGS. 5A to 5C are sectional views showing the steps of forming the dual damascene structure, which follow the step shown in FIG. 4B, according to the method of Embodiment 2.

Then, as shown in FIG. 5A, a second mask (having the wiring groove pattern) is formed on the a-Si film 24 (which constitutes the third mask having the connecting hole pattern 25) in such a way that at least part of the wiring groove pattern overlaps with it.

When the second mask is formed, a step (about 200 nm high) occurs in the underlayer of the resist mask 12. This step consists of the a-Si film 24, the SiN film 9, and the upper part of the $SiO_2$ film 8. Therefore, the second mask may become large near the step at the bottom of the connecting hole, as shown in FIG. 5A, because of incomplete alignment of the mask with the wiring groove pattern.

However, the enlarged part of the second mask does not pose any problem with the etching of the a-Si film 24 because the second mask for the wiring groove pattern is only necessary for the etching of the a-Si film 24 as the third mask. Thus the partial enlargement of the second mask is not a problem in this embodiment.

Another advantage of this embodiment is that the resist can be reclaimed without damage to the low dielectric constant film when the wiring groove pattern does not meet the product specification after processing. This is because the PAE film 7 does not expose itself.

Figure 5B:
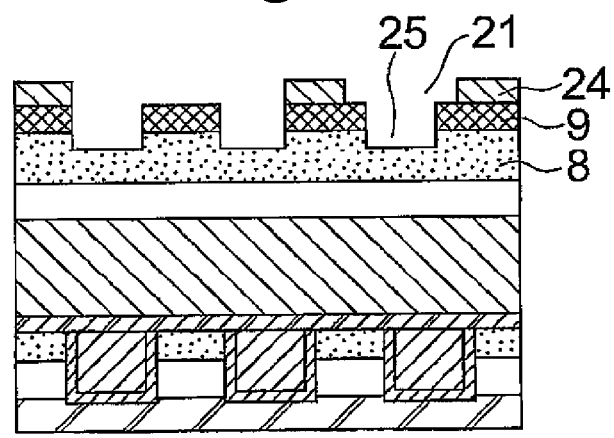
Figure 5C:
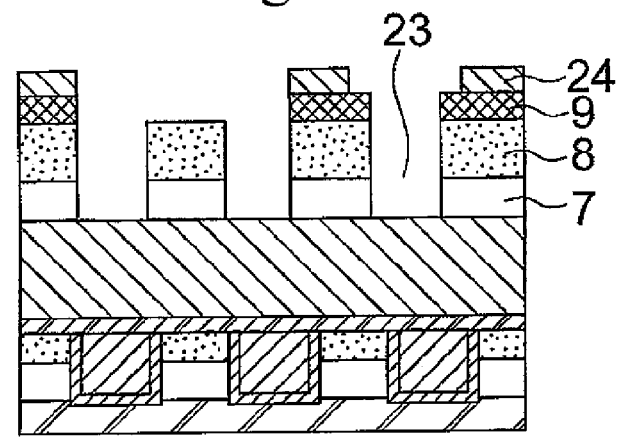

Then, dry etching is performed, through the second mask for the wiring groove pattern, on the a-Si film 24 (as the third mask) remaining at the opening of the wiring groove, thereby forming the wiring groove pattern 21 as shown in FIG. 5B.

This etching may be accomplished by using an ordinary plasma etching apparatus, with the RF power adjusted to 20 W and the substrate temperature adjusted to 0° C. This etching employs an etching gas composed of chlorine ($Cl_2$), hydrobromic acid (HBr), and oxygen ($O_2$), with their flow rate adjusted to 10:2:1 ($Cl_2$:HBr:$O_2$).

Etching under this condition allows a selectivity equal to or higher than 20 (Si/SiN) for the SiN film. Therefore, there hardly is the possibility that the underlying SiN film 9 (which becomes the second mask) undergoes etching.

Also, etching under this condition allows a selectivity equal to or higher than 20 (Si/$SiO_2$) for the $SiO_2$ film. Therefore, there hardly is the possibility that the $SiO_2$ film 8 (as the first mask forming layer) remaining at the bottom of the connecting hole undergoes etching locally.

Ashing with oxygen ($O_2$) plasma and chemical treatment with organic amine are performed to completely remove the second mask and residues remaining after etching, without causing damage to the PAE film 7.

Figure 6A:
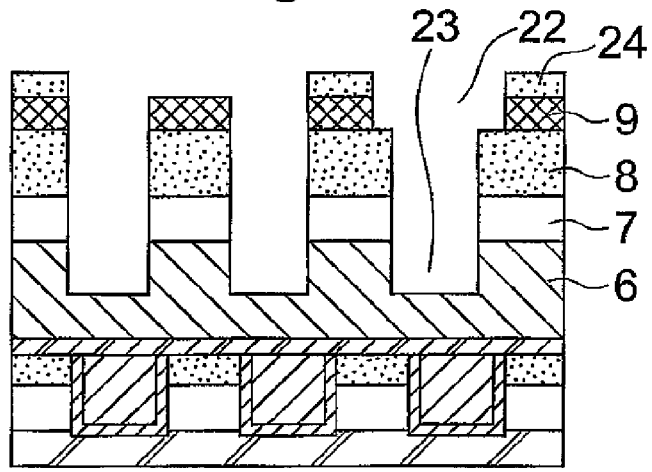
FIGS. 6A to 6C are sectional views showing the steps of forming the dual damascene structure, which follow the step shown in FIG. 5C, according to the method of Embodiment 2.

Dry etching is performed through the SiN film 9 (as the second mask having the connecting hole pattern 25 as shown in FIG. 4B). This dry etching forms the connecting hole 23 penetrating the $SiO_2$ film 8 (remaining at the bottom of the connecting hole) and the PAE film 7, as shown in FIG. 6A.

Etching on the $SiO_2$ film 8 may be accomplished by using an ordinary etching apparatus of magnetron type, with the bias power adjusted to 1200 W and the substrate temperature adjusted to 20° C. This etching employs an etching gas composed of octafluorobutane ($C_4F_8$), carbon monoxide (CO), and argon (Ar), with their flow rate adjusted to 1:5:20 ($C_4F_8$:CO:Ar).

Etching under this condition allows a selectivity equal to or higher than 10 ($SiO_2$/SiN) for the SiN film. Therefore, there hardly is the possibility that the SiN film 9 (which becomes the second mask) undergoes etching.

Etching on the PAE film 7 to make the connecting hole 23 may be accomplished by using an ordinary high-density plasma etching apparatus, with the RF power adjusted to 150 W and the substrate temperature adjusted to 20° C. This etching employs ammonia ($NH_3$) as an etching gas.

Etching under this condition allows a selectivity equal to or higher than 100 for the SiN film, $SiO_2$ film, and SiOC film.

Dry etching is performed through the a-Si film 24 (as the third mask having the wiring groove pattern 22) to form the wiring groove pattern 22 of the SiN film 9 which becomes the second mask, as shown in FIG. 6A.

This etching may be accomplished by using an ordinary etching apparatus of magnetron type, with the bias power adjusted to 100 W. This etching employs an etching gas composed of difluoromethane ($CH_2F_2$), oxygen ($O_2$), and argon (Ar), with their flow rate adjusted to 2:1:5 ($CH_2F_2$:$O_2$:Ar).

Etching under this condition allows a gas selectivity of about 10 (SiN/Si) for the a-Si film. Therefore, etching can be performed leaving a margin on the SiN film 9, 100 nm thick, as the second mask forming layer, so long as the a-Si film 24, as the third mask, is thicker than 30 nm.

Etching on the SiN film 9 (as the second mask) through the a-Si film 24 (as the third mask) may be accomplished in such a way that etching proceeds to the middle of the SiOC film 6 which exposes itself at the bottom of the connecting hole and then the connecting hole 23 is deepened.

Etching under this condition allows a selectivity slightly lower than 1 (SiN/SiOC) for the SiOC film. Therefore, the connecting hole 23 can be deepened to 150 to 200 nm (including the amount of overetching) in the SiOC film 6, if the SiN film 9 is 100 nm thick.

Figure 6B:
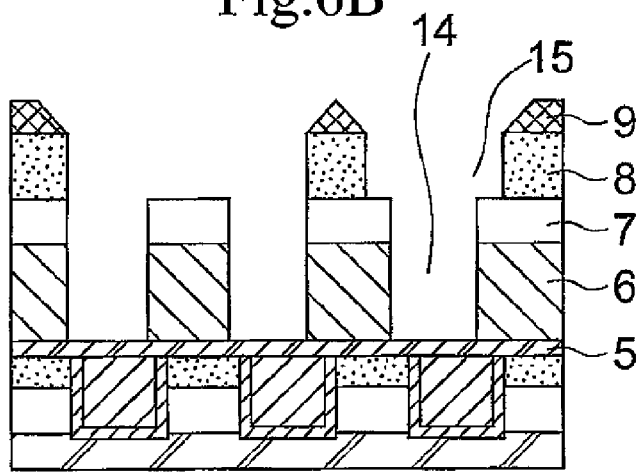

Etching is performed on the SiOC film 6 remaining at the bottom of the connecting hole 23, thereby making the connecting hole 14, as shown in FIG. 6B. This etching also makes the opening 15 in the $SiO_2$ film 8 (as the first mask) remaining in the wiring groove region by using the SiN film 9 (as the second mask 11) having the wiring groove pattern formed therein.

This etching may be accomplished by using an ordinary etching apparatus of magnetron type, with the bias power adjusted to 1600 W and the substrate temperature adjusted to 20° C. This etching employs an etching gas composed of octafluorocyclopenetene ($C_5F_8$), carbon monoxide (CO), argon (Ar), and oxygen ($O_2$), with their flow rate adjusted to 1:10:5:1 ($C_5F_8$:CO:Ar:$O_2$).

Etching under this condition allows a selectivity equal to or higher than 10 (SiOC/SiN) for the SiN film. Therefore, etching can be performed on the SiOC film 6, 200 to 250 nm thick, remaining at the bottom of the connecting hole so long as the SiN film 9 (as the second mask) is as thick as 100 nm. This etching forms an opening with a good shape leaving a sufficient margin without upward expanding and shoulder rounding.

Figure 6C:
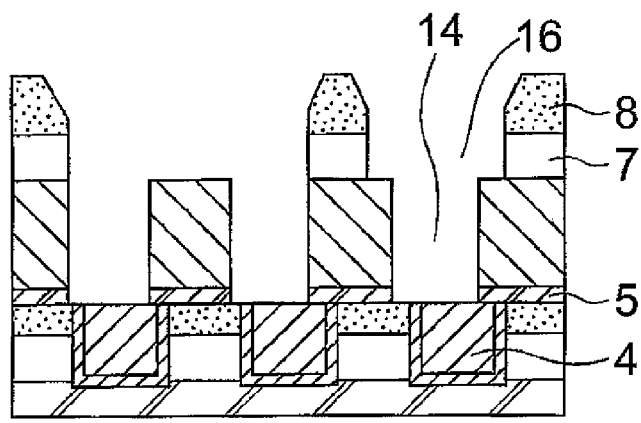

As in Embodiment 1, etching is performed on the PAE film 7 remaining at the bottom of the opening 15, thereby making the wiring groove 16, as shown in FIG. 6C. Etching is performed on the SiC film 5 at the bottom of the connecting hole 14, thereby causing the connecting hole 14 to communicate with the wiring 4 of buried Cu film. Thus, the desired dual damascene process is completed.

Subsequently, the same procedure as in Embodiment 1 may be repeated to obtain the multi-layer wiring of dual damascene structure, although it is not illustrated.

It should be noted that the SiN film 9 (as the second mask) remaining outside the wiring groove forming region is removed while etching is being performed on the SiC film 5 at the bottom of the connecting hole.

The above-mentioned steps to form the multi-layer wiring of dual damascene structure offer the advantage of giving rise to nearly no steps in the underlying layer when forming the resist mask 12 having the connecting hole pattern. This makes it possible to form the resist mask 12 having a highly accurate connecting hole pattern. This resist mask 12 makes it possible to form the minute opening of the connecting hole in a stable manner without deteriorating the shape of the wiring groove. This provides good via contact characteristics.

Another advantage is that the patterning of the connecting hole is performed and then the patterning of the wiring groove is performed, so that mask alignment for the upper layer wiring and the connecting hole is made directly. This makes it possible to form the multi-layer wiring with a minimum of alignment errors.

The dual damascene process consisting of the steps demonstrated in the above-mentioned embodiments makes it possible to produce in high yields semiconductor devices having the accurately patterned multi-layer wiring structure.

The interlayer insulating film in Embodiments 1 and 2 is not limited in film kind, film thickness, and film forming method to those mentioned above. For example, the SiC film 5 or 19 (as a layer to protect the Cu film from oxidation) may be replaced by an SiN film to be formed by CVD. Also, the SiC film may contain a light element such as nitrogen ($N_2$) and hydrogen (H).

The SiOC film 6, which becomes the inter layer for the connecting hole, may be replaced by an SiOF film or $SiO_2$ film formed by CVD process. The PAE film 7, which becomes the interlayer film for the wiring, may be replaced by an MSQ film or HSQ film formed by spin coating. Moreover, the PAE film may be replaced by a polyarylene ether film, amorphous carbon film, or polytetrafluoroethylene film. It may also be replaced by a xerogel film, porous MSQ film, organic polymer film or a combination of these.

In Embodiments 1 and 2, the $SiO_2$ film 8 (as the first mask forming layer which is formed on the PAE film and MSQ film), the SiN film 9 (as the second mask forming layer), and the $SiO_2$ film 20 or a-Si film 24 (as the third mask forming layer) have a thickness of 150 nm, 100 nm, and 50 nm, respectively. However, they are not limited to these kinds, thicknesses and forming procedures of the films so long as they permit the lower layer mask to be etched through the upper layer mask.

For example, the SiN film (as the second mask forming layer) may be replaced by a SiC film to be formed by CVD process. Moreover, these mask forming layers may be made thin so long as the etching selectivity permits.

For further thickness reduction, a fourth etching mask may be formed which has a higher etching selectivity for the third mask forming layer. In this way it is possible to reduce the step in the uppermost mask. In this case, the connecting hole is opened down to the PAE film 7, and then the wiring groove pattern is transferred to the lower mask forming layer by etching through the upper mask.

In Embodiment 1, the $SiO_2$ film 20 is formed as the uppermost third mask forming layer. It may be replaced by an amorphous silicon (a-Si) film formed by sputtering. In this way it is possible to reduce the thickness further.

In Embodiment 2, the a-Si film is formed as the uppermost third mask forming layer. It may be replaced by an $SiO_2$ film. However, if it is made of the same material as the first mask forming layer, care should be exercised about the amount of the $SiO_2$ film remaining at the bottom of the connecting hole shown in FIG. 5B. Otherwise, the PAE film 7 is likely to expose itself.

In Embodiments 1 and 2, $SiO_2$ film 8 eventually remains as much as about 50 nm as the wiring interlayer, as shown in FIG. 3A. However, the $SiO_2$ film as the first mask forming layer may be replaced by an inorganic low dielectric constant film, such as SiOF film, MSQ film, and HSQ film, unless problems are involved in adhesion to barrier metal, mechanical strength in Cu-CMP process, and damage induced by the reduction of Cu oxide which is carried out before the SiC film 19 (as the oxidation protecting layer) is formed.

Also, the first mask may be removed in the dual damascene etching process or the Cu-CMP process, if the above-mentioned problems are not involved.

The present invention is intended to produce a semiconductor device having a multi-layer wiring of dual damascene structure in an interlayer insulating film of low dielectric constant by forming three or more etching masks from at least two kinds of materials on the interlayer insulating film of low dielectric constant. This process offers the advantage of reducing the step in the underlying layer when the resist mask for the connecting hole is formed.

Another advantage is ascribed to the etching mask of triple- or multiple layer structure, which facilitates etching in the following manner. The first etching opens the connecting hole down to the middle of the interlayer film. Then, the second etching forms the wiring groove pattern in the lower layer mask through the uppermost layer mask. The third etching deepens the connecting hole down to the vicinity of the lower wiring layer. In this way it is possible to reduce the amount of etching necessary to make the connecting hole through the etching mask. This reduces the step of the etching mask and realizes the good shape by dual damascene process.

Another advantage is ascribed also to the etching mask of triple- or multiple layer structure which is formed from at least two kinds of material on the low dielectric constant film. This layer structure permits the resist to be patterned for the wiring groove after the connecting hole has been partly made. This eliminates the indirect mask alignment of the wiring groove and the connecting hole.

The process according to the present invention permits efficient production of highly integrated high-performance semiconductor devices having the multi-layer wiring of dual damascene structure.

The invention claimed is:

1. A process for production of a semiconductor device having interlayer insulating films including an organic insulating film, said process comprising:
   (a) a step of sequentially forming on a semiconductor substrate a first insulating film as an insulating film for penetrating a connecting hole, and a second insulating film as an interlayer insulating film for forming a wiring groove,
   (b) a step of sequentially forming on the second insulating film a first mask forming layer, a second mask forming layer, and a third mask forming layer, which are to be made into a first mask, a second mask, and a third mask, respectively,
   (c) a step of patterning the third mask forming layer, thereby forming the third mask having a wiring groove pattern,
   (d) a step of forming on the second mask forming layer including the third mask a resist mask having a connecting hole pattern,
   (e) a step of etching the third mask, the second mask forming layer, and the first mask forming layer through the resist mask, and etching further the second insulating film, thereby making the connecting hole,
   (f) a step of etching the second mask forming layer through the third mask, thereby forming the second mask having the wiring groove pattern and making the connecting hole to the middle of the first insulating film,
   (g) a step of etching the first mask forming layer through the second mask, thereby forming the first mask having the wiring groove pattern, and etching the first insulating film remaining at the bottom of the connecting hole, thereby making the connecting hole, (h) a step of etching the second insulating film through the first or second mask, thereby forming the wiring groove in the second insulating film, and (i) a step of removing at least the second and third masks.

2. The process for production of a semiconductor device as defined in claim 1, wherein, in step (a), the first insulating film is a methyl silsesquioxane film and the second insulating film is an organic film.

3. The process for production of a semiconductor device as defined in claim 1, wherein, in step (b), the first, second, and third mask forming layers are formed from materials which are transparent to light.

4. The process for production of a semiconductor device as defined in claim 1, wherein, in step (b), the first, second, and third mask forming layers are formed from materials that permit a lower mask forming layer to be etched by reactive ion etching through a mask formed of an upper mask forming layer.

5. The process for production of a semiconductor device as defined in claim 1, wherein, in step (b), the first mask forming layer is a silicon oxide film, the second mask forming layer is a silicon nitride film, and the third mask forming layer is a silicon oxide film.

* * * * *